(12) United States Patent
Kitagawa

(10) Patent No.: US 7,755,937 B2
(45) Date of Patent: Jul. 13, 2010

(54) SEMICONDUCTOR DEVICE

(75) Inventor: Makoto Kitagawa, Kanagawa (JP)

(73) Assignee: Sony Corporation, Tokyo (JP)

( * ) Notice: Subject to any disclaimer, the term of this patent is extended or adjusted under 35 U.S.C. 154(b) by 120 days.

(21) Appl. No.: 12/232,046

(22) Filed: Sep. 10, 2008

(65) Prior Publication Data

US 2009/0086537 A1 Apr. 2, 2009

(30) Foreign Application Priority Data

Sep. 27, 2007 (JP) ............................ P2007-252398

(51) Int. Cl.
*G11C 11/34* (2006.01)
(52) U.S. Cl. ........................ 365/180; 365/175; 365/181; 365/205
(58) Field of Classification Search ................. 365/175, 365/180, 181, 205
See application file for complete search history.

(56) References Cited

U.S. PATENT DOCUMENTS

| 2004/0004880 A1* | 1/2004 | Yoon et al. ................... 365/205 |
| 2004/0071013 A1* | 4/2004 | Yoon et al. ................... 365/174 |
| 2007/0096203 A1* | 5/2007 | Mouli .......................... 257/330 |
| 2008/0242009 A1* | 10/2008 | Cho ............................. 438/135 |

FOREIGN PATENT DOCUMENTS

| JP | 2002-246560 | 8/2002 |
| JP | 2007-049113 | 2/2007 |
| JP | 2007-067133 | 3/2007 |

OTHER PUBLICATIONS

F. Nemati et al., "A Novel Thyristor-based SRAM Cell (T-RAM) for High-Speed, Low-Voltage, Giga-scale Memories", Technical Digest IEDM 1999, pp. 283-286, Stanford, CA.
R. Roy et al., "Thyristor-Based Volatile Memory in Nano-Scale CMOS", 2006 IEEE International Solid-State Circuits Conference, pp. 632-633.

* cited by examiner

*Primary Examiner*—Hoai V Ho
(74) *Attorney, Agent, or Firm*—Fishman & Grauer PLLC

(57) ABSTRACT

A semiconductor device, includes a memory cell including a thyristor element with a gate having a pnpn structure formed on a semiconductor substrate and having first and second terminals, and an access transistor formed on the semiconductor substrate and having first and second terminals connected to a bit line and the first terminal of the thyristor element, respectively, and a control section including a load current element whose load current flows, upon reading out operation, to the second terminal side of the thyristor element and configured to carry out access control to the memory cell.

16 Claims, 16 Drawing Sheets

[STANDBY]

[STANDBY]

[READING OUT]

[READING OUT]

[WRITING OF DATA 1]

[WRITING OF DATA 1]

[WRITING OF DATA 0]

[WRITING OF DATA 0]

[READ DISTURB]

[READ DISTURB]

SEMICONDUCTOR DEVICE

CROSS REFERENCES TO RELATED APPLICATIONS

The present invention contains subject matter related to Japanese Patent Application JP 2007-252398 filed with the Japan Patent Office on Sep. 27, 2007, the entire contents of which being incorporated herein by reference.

BACKGROUND OF THE INVENTION

1. Field of the Invention

This invention relates to a semiconductor device wherein a memory cell or memory element is formed from an access transistor and a thyristor element.

2. Description of the Related Art

Various forms have been proposed for a memory cell or thyristor RAM cell formed from a thyristor element and an access transistor and are disclosed, for example, in Japanese Patent Laid-Open Nos. 2007-49113 (hereinafter referred to as Patent Document 1), 2007-67133 (hereinafter referred to as Patent Document 2) and 2002-246560 (hereinafter referred to as Patent Document 3), Rich Roy, Farid Nemati, Ken Young, Bruce Bateman, Rajesh Chopra, Seong-Ook Jung, Chiming Show, and Hyun-Jin Cho, 2006 IEEE International Solid-State Circuits Conference, pp. 632-633 (hereinafter referred to as Non-Patent Document 1), and Farid Nemati and James D. Plummer, Technical Digest IEDM 199, pp. 283-286 (hereinafter referred to as Non-Patent Document 2).

One of such memory cells as mentioned above is a memory device which includes a thyristor element and an access transistor formed on a bulk-type semiconductor substrate.

FIG. 1 is a simplified schematic cross sectional view showing an example of a configuration of a memory cell including a thyristor element and an access transistor formed on a bulk-type semiconductor substrate. The thyristor element of the memory cell is of the selective epitaxy anode (SEA) type.

Meanwhile, FIG. 2 is an equivalent circuit diagram of the memory cell of FIG. 1.

Referring to FIGS. 1 and 2, the memory element 1 shown includes a thyristor element 3 and an access transistor 4 formed in parallel to each other across an element isolation region 5 on a bulk-type semiconductor substrate 2 of the p-type.

The thyristor element 3 has a pnpn thyristor structure wherein a p-type anode 32, an n-type anode 33, a p-type base 34 and an n-type cathode 35 are formed on an n-type well 31.

A gate electrode 37 is formed on the p-type base 34 with a gate insulating film 36 interposed therebetween.

The thyristor element 3 has a combination of bipolar transistors of the npn type and the pnp type, which have a common base and a common collector. Further, the gate electrode 37 of the MIS type is formed on the base of the npn type.

The access transistor 4 includes n-type diffusion layers 42 and 43 formed in a p-type well 41, and a gate electrode 45 formed on the p-type well 41 sandwiched between the diffusion layers 42 and 43 with a gate insulating film 44 interposed therebetween.

The p-type anode 32 of the thyristor element 3 is connected to a supply line LVREF of a reference voltage Vref, and the diffusion layer 42 of the access transistor 4 is connected to a bit line BL while the n-type cathode 35 of the thyristor element 3 and the diffusion layer 43 of the access transistor 4 are connected to each other by a storage node VSN.

The gate electrode 37 of the thyristor element 3 is connected to a word line TWL, and the gate electrode 45 of the access transistor 4 is connected to another word line SWL.

The thyristor element having such a configuration as described above has a negative resistance characteristic and has two stable points. The two stable points are read as 0 and 1 of data.

In the following, the voltage or potential state of a thyristor RAM cell upon operation is described.

FIGS. 3A and 3B illustrate a potential state when the thyristor RAM cell retains data.

When the thyristor RAM cell retains data, the word lines SWL and TWL are set to 0 V, that is, to an off state, and also the bit line is set to 0 V as seen in FIG. 3A.

At this time, as seen in FIG. 3B, a stable point at which thyristor current It and access transistor current Ia balance with each other is given only by two states, and the two stable states are allocated to "0" and "1" of data to store or retain data.

FIGS. 4A and 4B illustrate a potential state upon data reading out operation of the thyristor RAM cell.

Upon reading out operation of the thyristor RAM cell, the word line TWL is set to 0 V while the word line SWL is set to a power supply voltage VDD and the bit line BL is precharged to 0 V as seen in FIG. 4A.

At this time, while a stable point in the retaining state is maintained, the current value changes at the stable point, and consequently, data reading out operation can be carried out by reading out the current value.

FIGS. 5A and 5B illustrate a potential state upon data writing operation of the thyristor RAM cell.

Upon writing operation of data "1" during which the cell current is high, the word line TWL is set to the power supply voltage VDD and also the word line SWL is set to the power supply voltage VDD while the bit line BL is set to 0 V as seen in FIG. 5A.

In this potential state, since only one stable state in which the cell current is high is provided as seen in FIG. 5B, data "1" can be written.

FIGS. 6A and 6B illustrate a potential state upon writing operation of data "0" into the thyristor RAM cell.

Upon writing operation of data "0" during which the cell current is low, the word line TWL is set to the power supply voltage VDD and also the word line SWL is set to the power supply voltage VDD while the bit line BL is set to the power supply voltage VDD as seen in FIG. 6A.

In this potential state, since only one stable state in which the cell current is low is provided as seen in FIG. 6B, data "0" can be written.

SUMMARY OF THE INVENTION

However, the thyristor RAM cell described above is disadvantageous in that there is the possibility that, upon reading out operation of the thyristor RAM cell described above, disturb may occur.

Here, disturb upon reading out operation is described.

Although, upon reading out operation, cell current is read out after the bit line BL is reset to 0 V as described hereinabove with reference to FIGS. 4A and 4B, where the cell current reading out is carried out through the bit line BL, when the cell current is high, that is, upon reading out of data "1," the potential at the bit line BL is high, but when the cell current is low, that is, upon reading out of data "0," the potential at the bit line BL is almost equal to 0 V. In this manner, it is necessary to convert current of the bit line BL into a voltage to carry out reading out.

In this instance, as seen in FIGS. 7A and 7B, as the potential of the bit line BL rises, also the cell stable points vary. If the potential of the bit line BL becomes excessively high, then the stable point on the high cell current side regarding data "1" disappears, resulting in the possibility that the data may be broken.

For example, in such a case that the bit line BL is reset to 0 V and then the bit line BL is charged in response to cell current to carry out reading out operation as disclosed in Non-Patent Document 1 mentioned hereinabove, read disturb mentioned hereinabove may possibly occur.

Therefore, it is demanded to provide a semiconductor device which can prevent occurrence of disturb upon reading out operation.

According to an embodiment of the present invention, there is provided a semiconductor device including a memory cell including a thyristor element with a gate having a pnpn structure formed on a semiconductor substrate and having first and second terminals, and an access transistor formed on the semiconductor substrate and having first and second terminals connected to a bit line and the first terminal of the thyristor element, respectively. The semiconductor device further includes a control section including a load current element whose load current flows, upon reading out operation, to the second terminal side of the thyristor element and configured to carry out access control to the memory cell, the control section converting, upon reading out operation, current flowing through the memory cell into a voltage in a state wherein the bit line is fixed to a first voltage and the second terminal side of the thyristor element is set to a second voltage higher than the first voltage to carry out decision of read out data.

Preferably, the semiconductor device still further includes a circuit configured to clamp the potential at the bit line and the potential at the second terminal of the thyristor element to desired voltages.

Preferably, the control section varies, upon writing operation, the voltage to the bit line connected to the access transistor in response to write data and sets the second terminal of the thyristor element to a desired fixed voltage.

Preferably, the control section varies, upon writing operation, the voltage to the bit line connected to the access transistor in response to write data and sets the second terminal of the thyristor element to a desired fixed voltage both upon reading out operation and upon writing operation.

Preferably, the control section controls, upon reading out operation, the access transistor to be turned on from between the thyristor element and the access transistor, but controls, upon writing operation, both of the thyristor element and the access transistor to an on state.

Preferably, the control section includes a sense amplifier configured to compare, upon reading out operation, the voltage which varies in response to cell current of the thyristor element and a reference voltage with each other in a state wherein the second terminal of the thyristor element is clamped to a desired voltage and output read data in accordance with a result of the comparison.

Preferably, the control section includes a write driver configured to drive, upon writing operation, the bit line connected to the access transistor to a voltage in accordance with write data.

According to another embodiment of the present invention, there is provided a semiconductor device including a first bit line, a second bit line, a memory cell including a thyristor element with a gate having a pnpn structure formed on a semiconductor substrate and having first and second terminals, and an access transistor formed on the semiconductor substrate and having first and second terminals connected to a first bit line and the first terminal of the thyristor element, respectively. The semiconductor device further includes a control section including a load current element configured to supply, upon reading out, load current to the second bit line side connected to the second terminal of the thyristor element and configured to carry out access control to the memory cell, the control section being operable to detect, upon reading out operation, a variation of current flowing from the second bit line to the second terminal of the thyristor element in a state wherein the first bit line is fixed to a first voltage and the second bit line is fixed to a second voltage higher than the first voltage and convert the detected current into a voltage to carry out decision of read out data.

Preferably, the semiconductor device further includes a circuit configured to clamp the potentials at the first bit line and the second bit line to desired voltages.

Preferably, the control section varies the voltage to the bit line connected to the access transistor in accordance with data, but sets the voltage to the second bit line connected to a reference potential terminal of the thyristor element to a desired fixed voltage both upon reading out operation and upon writing operation.

Preferably, the control section varies, upon writing operation, the voltage to the first bit line connected to the access transistor in accordance with write data and sets the voltage to the second bit line connected to the second terminal of the thyristor element to a desired fixed voltage both upon reading out operation and upon writing operation.

Preferably, the control section turns on, upon reading out operation, the access transistor from between the thyristor element and the access transistor to carry out reading out of data through the second bit line, but controls, upon writing operation, both of the thyristor element and the access transistor to an on state to transfer write data to the first bit line.

Preferably, the control section includes a sense amplifier configured to compare, upon reading out operation, a voltage which varies in response to cell current of the thyristor element and a reference voltage with each other in a state wherein the second bit line is clamped to a desired voltage and output read data in accordance with a result of the comparison.

Preferably, the control section includes a write driver configured to drive, upon writing operation, the first bit line connected to the access transistor to a voltage in accordance with write data.

With the semiconductor device, occurrence of disturb upon reading out operation can be suppressed.

DETAILED DESCRIPTION OF THE PREFERRED EMBODIMENT

Figure 8:
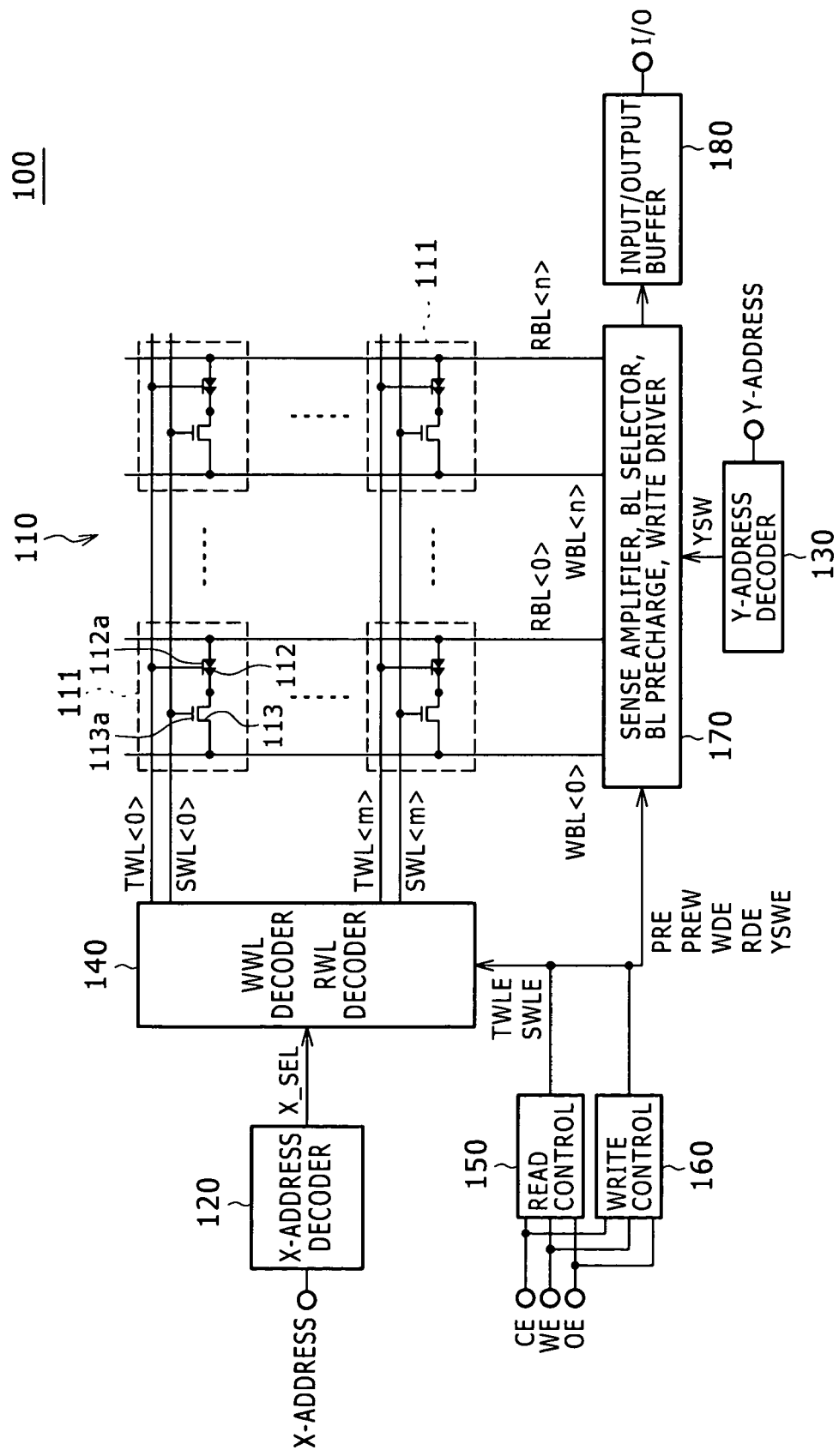
FIG. 8 is a block diagram showing a general configuration of a semiconductor device to which the present embodiment is applied.

FIG. 8 shows a general configuration of a semiconductor device to which the present embodiment is applied.

Referring to FIG. 8, the semiconductor device 100 shown includes a memory array section 110, an X address or row address decoder 120, a Y address or column address decoder 130, a word line decoder 140, a read control section 150, a write control section 160, a Y control section or column control section 170 and an input/output buffer 180.

The word line decoder 140, read control section 150, write control section 160, Y control section or column control section 170 and so forth cooperatively form a control section.

The memory array section 110 includes a plurality of thyristor RAM cells or memory cells 111 disposed in a matrix of m rows and n columns (m×n). It is to be noted that, in FIG. 8, the thyristor RAM cells 111 are shown disposed in a matrix of 2 rows and 2 columns for simplified illustration.

Each of the thyristor RAM cells 111 includes a thyristor element 112 having a pnpn structure formed on a semiconductor layer of a bulk-type semiconductor substrate, and an access transistor 113 formed on the semiconductor layer of the semiconductor substrate and connected to a first terminal of the thyristor element 112.

Figure 1:
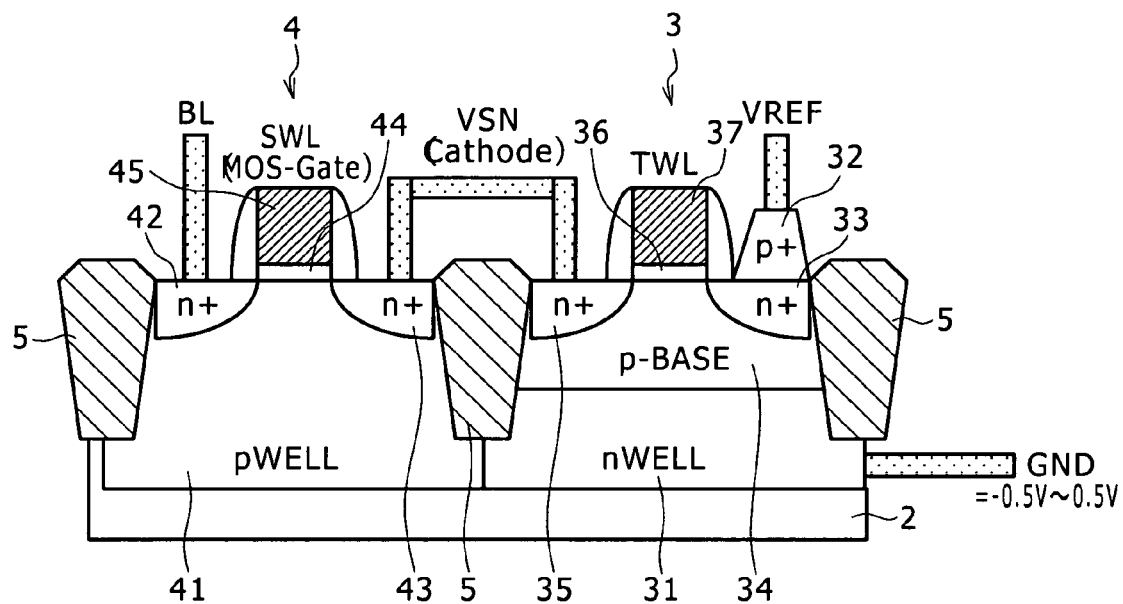
FIG. 1 is a schematic cross sectional view showing an example of a configuration of a cell of a memory device including a thyristor element and an access transistor formed on a bulk-type semiconductor substrate.
Figure 2:
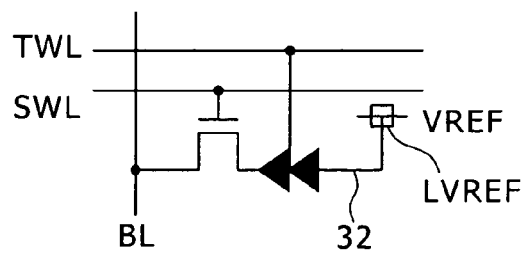
FIG. 2 is an equivalent circuit diagram of the memory device of FIG. 1.
Figure 3A:
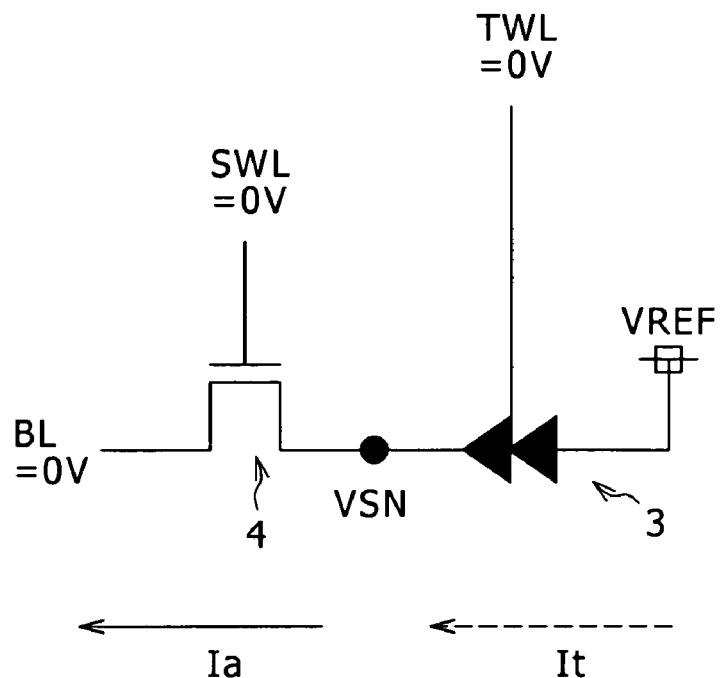
FIGS. 3A and 3B are a circuit diagram and a diagrammatic view, respectively, illustrating a potential state of a thyristor RAM cell upon data storage.
Figure 3B:
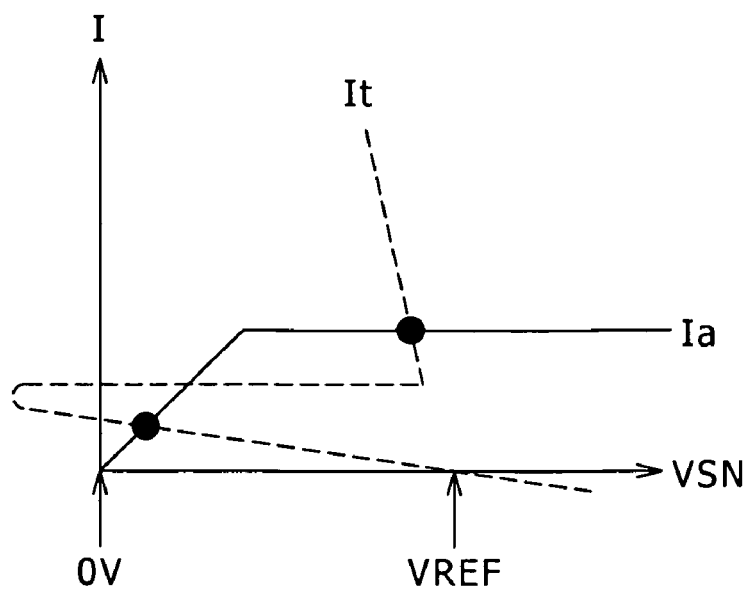
Figure 4A:
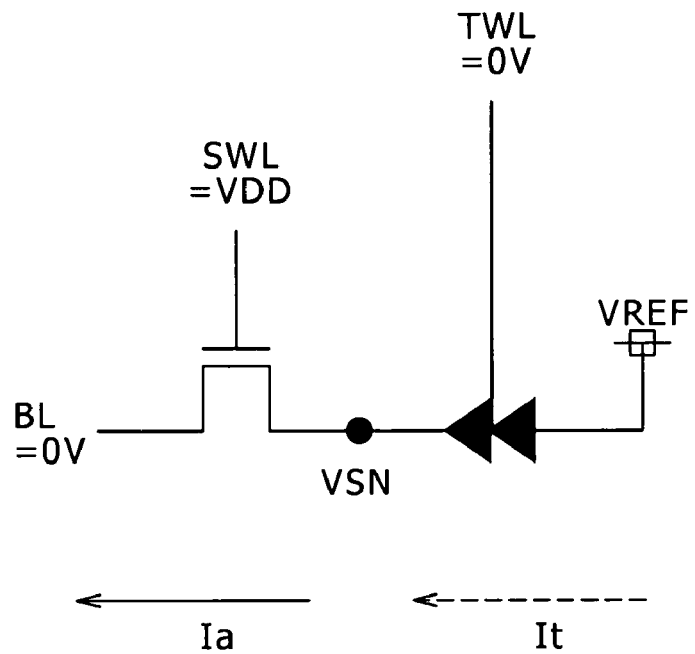
FIGS. 4A and 4B are a circuit diagram and a diagrammatic view, respectively, illustrating a potential state of the thyristor RAM cell upon data reading out operation.
Figure 4B:
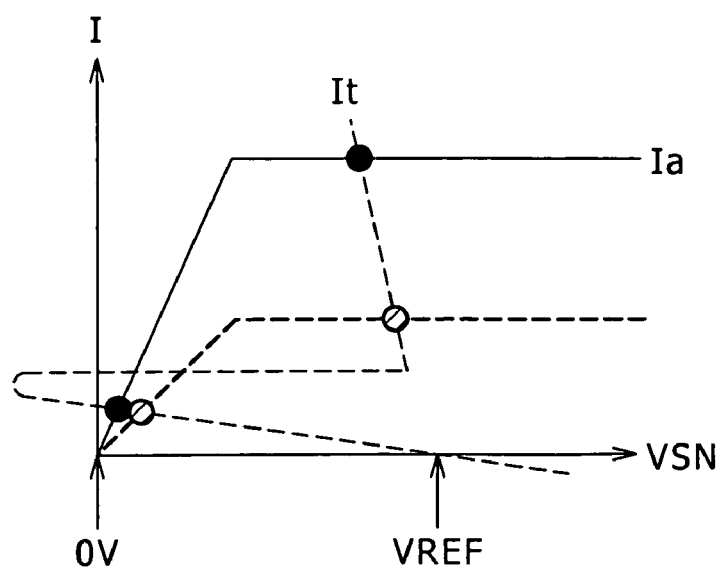

As a device structure of the thyristor RAM cell 111, for example, such a structure as described hereinabove with reference to FIG. 1 can be adopted. However, the device structure is not limited to this, but various structures may be applied.

In the memory array section 110, first word lines TWL<0> to TWL<m> for thyristors and second word lines SWL<0> to SWL<m> for access transistors are wired for each row individually corresponding to row arrangements of the thyristor RAM cells 111.

Further, in the memory array section 110, first bit lines or write bit lines WBL<0> to WBL<n> for writing and second bit lines or read bit lines RBL<0> to RBL<n> for reading are wired for each column individually corresponding to column arrangements of the thyristor RAM cells 111 such that they extend perpendicularly to the first and second word lines.

Further, the gate electrodes 112a of the thyristor elements 112 of the thyristor RAM cells 111 disposed on the same row are connected commonly to one of the first word lines TWL<0> to TWL<m> which is wired in the corresponding row. Similarly, the gate electrodes 113a of the access transistors 113 of the thyristor RAM cells 111 disposed on the same row are connected commonly to one of the second word lines SWL<0> to SWL<m> which is wired in the corresponding row.

Further, diffusion layers or source-drain regions on one side of the access transistors 113 of the thyristor RAM cells 111 disposed on the same column are connected commonly to one of the first bit lines WBL<0> to WBL<n> which is wired in the corresponding column. Similarly, the p-type anodes of the thyristor elements 112 of the thyristor RAM cells 111 disposed on the same column are connected commonly to one of the second bit lines RBL<0> to RBL<n> which is wired in the corresponding column.

As an example, if it is assumed to the thyristor RAM cells 111 have the device structure described hereinabove with reference to FIG. 1, then the diffusion layers 42 of the access transistors are connected commonly to one of the first bit lines WBL<0> to WBL<n> which is wired corresponding to the same column, and the p-type anodes 32 of the thyristor elements are connected commonly to one of the second bit lines RBL<0> to RBL<n> which is wired corresponding to the same column through a supply line LVREF for the reference voltage VREF or directly.

The X address decoder 120 receives X addresses X0, X1, . . . and renders X select signals XSEL0, XCEL1, . . . , which designate word lines to be selected, active, for example, to the high level. Then, the X address decoder 120 outputs the X select signal to the word line decoder 140.

Figure 9:
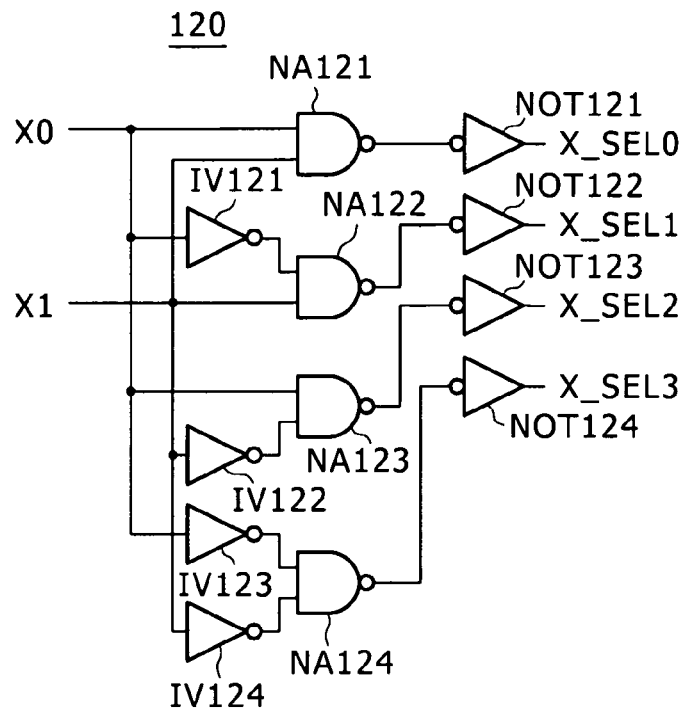
FIG. 9 is a circuit diagram showing an example of a basic configuration of an X address decoder of the semiconductor device of FIG. 8.

FIG. 9 shows an example of a basic configuration of the X address decoder according to the present embodiment.

Referring to FIG. 9, the X address decoder 120 shown has a basic configuration ready for input of the two addresses X0 and X1.

The X address decoder 120 includes 2-input NAND circuits NA121 to NA124, inverters IV121 to IV124, and NOT circuits NOT121 to NOT124.

The first inputs of the NAND circuits NA121 and NA123 and the inputs of the inverters IV121 and IV123 are connected to an input line of the X address X0.

The second input of the NAND circuit NA121, the second input of the NAND circuit NA122 and the inputs of the inverters IV122 and IV124 are connected to an input line of the X address X1. Further, the output of the inverter IV121 is connected to the first input of the NAND circuit NA122, and the output of the inverter IV122 is connected to the second input of the NAND circuit NA123. Further, the output of the inverter IV123 is connected to the first input of the NAND circuit NA124, and the output of the inverter IV124 is connected to the second input of the NAND circuit NA124.

The output of the NAND circuit NA121 is connected to the input of the NOT circuit NOT121, and the output of the NAND circuit NA122 is connected to the input of the NOT circuit NOT122. Further, the output of the NAND circuit NA123 is connected to the input of the NOT circuit NOT123, and the output of the NAND circuit NA124 is connected to the input of the NOT circuit NOT124.

In the X address decoder 120, when the X addresses (X1, X0) are (0, 0), an X select signal X_SEL3 is outputted in an active high-level state from the NOT circuit NOT124.

When the X addresses (X1, X0) is (0, 1), another X select signal X_SEL2 is outputted in an active high-level state from the NOT circuit NOT123.

When the X addresses (X1, X0) is (1, 0), a further X select signal X_SEL1 is outputted in an active high-level state from the NOT circuit NOT122.

When the X addresses (X1, X0) is (1, 1), a still further X select signal X_SEL0 is outputted in an active high-level state from the NOT circuit NOT121.

The Y address decoder 130 receives Y addresses Y0, Y1, . . . and renders complementary Y switch signals YSW_W, YSW_RA, YSW_RB and YSW_RC for selectively switching on Y switches to which bit lines are connected to be selected by a bit line selector active and inverted signals of the Y switch signals. Then, the Y address decoder 130 outputs the Y switch signals and the inverted signals to the Y control section 170.

Figure 10:
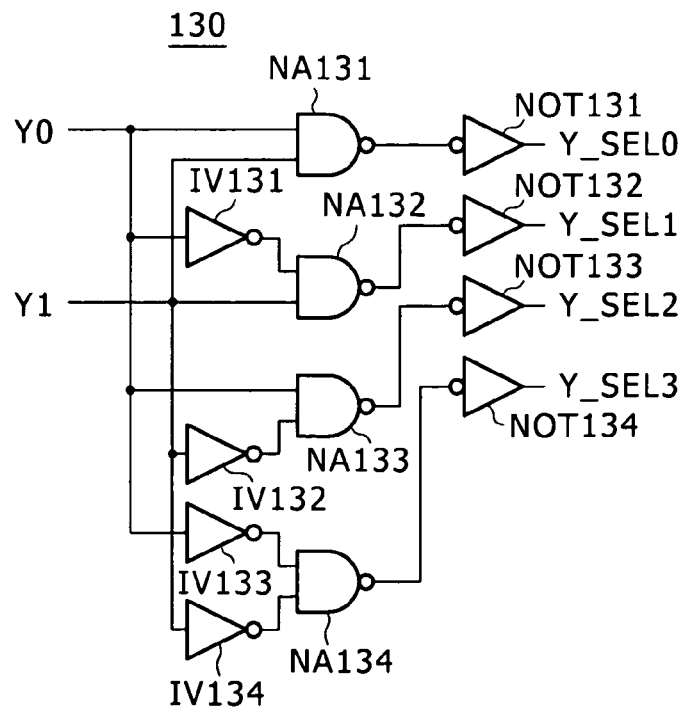
FIG. 10 is a circuit diagram showing an example of a basic configuration of a Y address decoder of the semiconductor device of FIG. 8.

FIG. 10 shows an example of a basic configuration of the Y address decoder used in the present embodiment.

Referring to FIG. 10, the Y address decoder 130 shown has, as a basic configuration, a configuration ready for inputs of two addresses Y0 and Y1.

The Y address decoder 130 includes 2-input NAND circuits NA131 to NA134, inverters IV131 to IV134, and NOT circuits NOT131 to NOT134.

The first inputs of the NAND circuits NA131 and NA133 and the inputs of the inverters IV131 and IV133 are connected to an input line for the Y address Y0.

The second input of the NAND circuit NA131, the second input of the NAND circuit NA132 and the inputs of the inverters IV132 and IV134 are connected to an input line for the Y address Y1. Further, the output of the inverter IV131 is connected to the first input of the NAND circuit NA132, and the output of the inverter IV132 is connected to the second input of the NAND circuit NA133. Further, the output of the inverter IV133 is connected to the first input of the NAND circuit NA134, and the output of the inverter IV134 is connected to the second input of the NAND circuit NA134.

The output of the NAND circuit NA131 is connected to the input of the NOT circuit NOT131, and the output of the NAND circuit NA132 is connected to the input of the NOT circuit NOT132. Further, the output of the NAND circuit NA133 is connected to the input of the NOT circuit NOT133, and the output of the NAND circuit NA134 is connected to the input of the NOT circuit NOT134.

In the Y address decoder 130, when the Y addresses (Y1, Y0) are (0, 0), a Y select signal Y_SEL3 is outputted in an active high-level state from the NOT circuit NOT134.

When the Y addresses (Y1, Y0) is (0, 1), another Y select signal Y_SEL2 is outputted in an active high-level state from the NOT circuit NOT133.

When the Y addresses (Y1, Y0) is (1, 0), a further Y select signal Y_SEL1 is outputted in an active high-level state from the NOT circuit NOT132.

When the Y addresses (Y1, Y0) is (1, 1), a still further Y select signal Y_SEL0 is outputted in an active high-level state from the NOT circuit NOT131.

Figure 11:
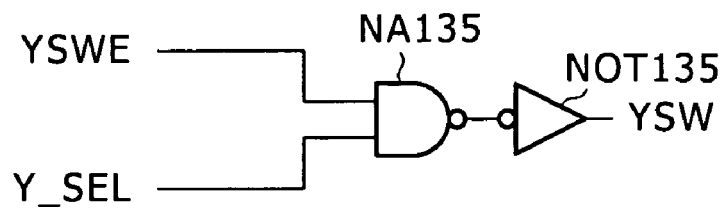
FIG. 11 is a circuit diagram showing an example of a configuration of a YSW decoder used in the Y address decoder of FIG. 10.

FIG. 11 shows an example of a configuration of the YSW decoder in the Y address decoder in the present embodiment.

Referring to FIG. 11, the YSW decoder 131 includes a 2-input NAND circuit NA135 and a NOT circuit 135.

A Y select signal Y_SEL produced by the Y address decoder 130 and a Y switch enable signal YSWE from the read control section 150 or the write control section 160 are inputted to the NAND circuit NA135, and a result of NANDing by the NAND circuit NA135 is outputted as an activated Y switch signal YSW through the NOT circuit NOT135.

The Y switch signal YSW is activated both upon reading out operation and upon writing operation.

Referring back to FIG. 8, the word line decoder 140 drives a first word line TWL and a second word lines SWL designated by an X address in response to an X select signal X_SEL from the X address decoder 120 and a first word line enable signal TWLE and a second word line enable signal SWLE from the read control section 150 or the write control section 160. In other words, the word line decoder 140 sets the first word line TWL and the second word line SWL to the high level.

It is to be noted that, upon reading out operation, the second word line enable signal SWLE is activated, but upon writing operation, both of the first word line enable signal TWLE and the second word line enable signal SWLE are activated.

Figure 12:
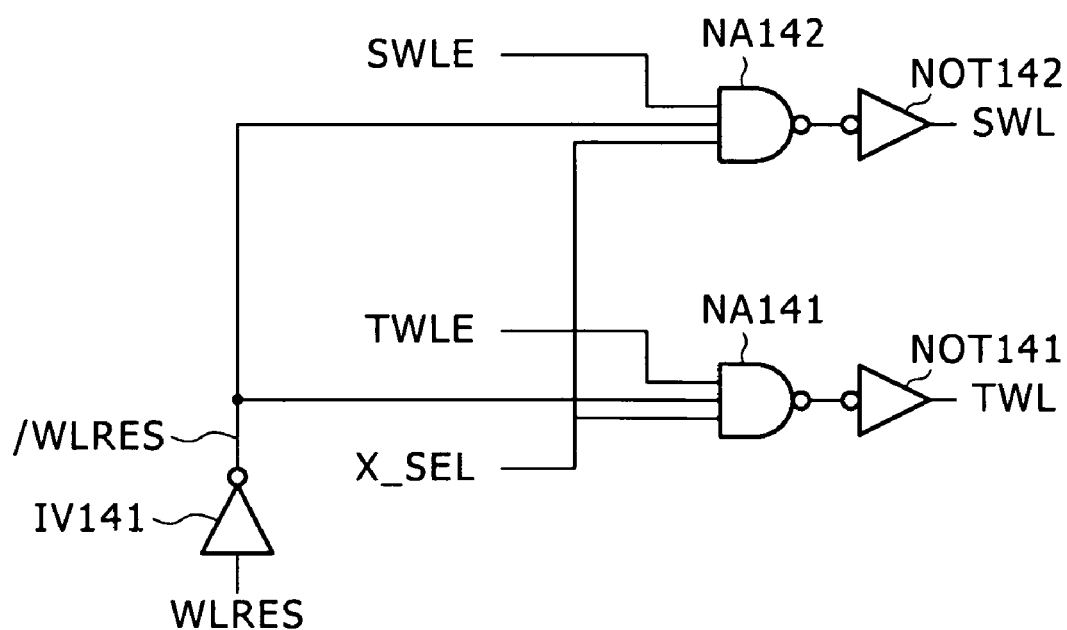
FIG. 12 is a circuit diagram showing an example of a configuration of a word line decoder of the semiconductor device of FIG. 8.

FIG. 12 shows an example of a configuration of the word line decoder in the present embodiment.

Referring to FIG. 12, the word line decoder 140 includes 2-input NAND circuits NA141 and NA142 and NOT circuits NOT141 and NOT142.

An X select signal X_SEL produced by the X address decoder 120 and a first word line enable signal TWLE from the read control section 150 or the write control section 160 are inputted to the NAND circuit NA141, and a result of NANDing by the NAND circuit NA141 is outputted as a driving signal through the NOT circuit NOT141 to drive the first word line TWL of the row designated by the X address.

Similarly, the X select signal X_SEL produced by the X address decoder 120 and a second word line enable signal SWLE from the read control section 150 or the write control section 160 are inputted to the NAND circuit NA142, and a result of NANDing by the NAND circuit NA142 is outputted as a driving signal through the NOT circuit NOT142 to drive the second word line SWL of the row designated by the X address.

The read control section 150 receives a chip enable signal CE, a write enable signal WE, and an output enable signal OE from the outside to decide whether or not the current mode is a reading out mode.

If the read control section 150 decides that the current mode is a reading out mode, then it outputs the second word line enable signal SWLE in an active high-level state to the word line decoder 140. Then, within a reading out period, the read control section 150 changes over the read precharge signal PRER from the high level to the low level to set a read data enable signal or reading out activation signal RDE to the high level, a write data enable signal or writing activation signal WDE to the low level and a Y switch enable signal YSWE to the high level. Then, the read control section 150 outputs the read data enable signal RDE, write data enable signal WDE and Y switch enable signal YSWE to the Y control section 170.

The write control section 160 receives a chip enable signal CE, a write enable signal WE and an on-chip enable signal OE from the outside to decide whether or not the current mode is a writing mode.

If the write control section 160 decides that the current mode is a writing mode, then it outputs the first word line enable signal TWLE and the second word line enable signal SWLE in an active high-level state to the word line decoder 140. Then, within a writing period, the write control section 160 changes over the write precharge signal PREW from the high level to the low level to set the read precharge signal PRER to the low level, write data enable signal WDE to the high level, read data enable signal RDE to the low level and Y switch enable signal YSWE to the high level. Then, the write control section 160 outputs the read precharge signal PRER, write data enable signal WDE, read data enable signal RDE and Y switch enable signal YSWE to the Y control section 170.

The Y control section 170 carries out precharge control of the first bit lines WBL<0> to WBL<n> and second bit lines RBL<0> to RBL<n>, and voltage control of the first bit lines WBL<0> to WBL<n> and second bit lines RBL<0> to RBL<n> upon writing operation and reading out operation. The Y control section 170 further carries out transfer control of write data to the first bit lines WBL<0> to WBL<n> and transfer control of read data (read out data) to a sense amplifier (SA) including on/off control of the Y switch of the Y selector by the Y switch signal YSW.

The Y control section 170 detects current flowing from the sense amplifier to the p-type anode terminal of the thyristor element 112, that is, the VREF terminal, in a state wherein the first bit line WBL to be connected to the access transistor 113 upon reading out operation is set to a fixed voltage, that is, a first voltage, in the proximity of the ground potential GND and the VREF terminal, that is, a voltage at the second bit line RBL, which is a second voltage VREF higher than the first voltage and is, for example, 0.9 V, is fixed. Then, the Y control section 170 converts the detected current into a voltage by means of the sense amplifier thereof to carry out reading out of data.

In this instance, the Y control section 170 controls both of the potential at the first bit line WBL and the p-type anode voltage, that is, the VREF terminal, of the thyristor element 112 so as to be clamped to a desired voltage.

Further, in the present embodiment, the Y control section 170 controls the voltage at the first bit line WBL which is connected to the access transistor 113 upon writing operation of data into the thyristor RAM cell 111 to be varied and controls the p-type anode terminal, that is, the VREF terminal, of the thyristor element 112 to be set to a desired fixed voltage both upon reading out operation and upon writing operation.

Figure 13:
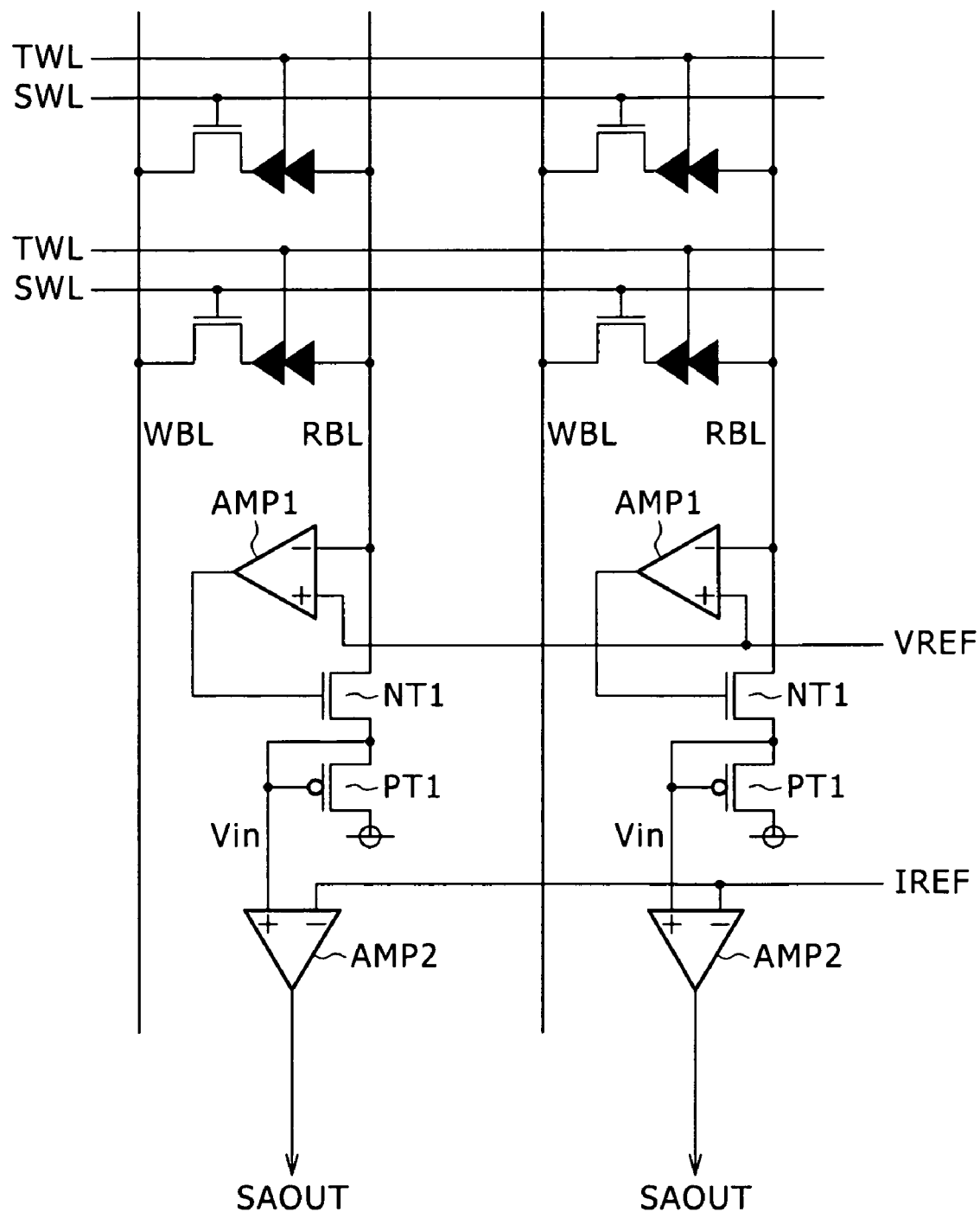
FIG. 13 is a circuit diagram showing an example of a configuration of a sense amplifier and illustrating a principle of reading out operation of the semiconductor device of FIG. 8.

As described above, the Y control section 170 has a sense amplifier for reading out operation, and the reading out control section of the Y control section 170 can be configured, for example, in such a manner as seen in FIG. 13.

FIG. 13 shows an example of a configuration of the sense amplifier and illustrating a principle of reading out operation of the semiconductor device according to the present embodiment.

It is to be noted that, in FIG. 13, the precharge circuit, Y selector, write driver and so forth are omitted to simplify illustration of the principle of the reading out operation.

Referring to FIG. 13, the sense amplifier SA1 shown includes a negative feedback amplifier AMP1, a p-channel MOS (PMOS) transistor PT1 connected in diode connection, an n-channel MOS (NMOS) transistor NT1 for clamping, and an amplifier AMP2 for comparison operation.

The negative feedback amplifier AMP1 is connected at the negated input terminal (−) thereof to the second bit line RBL through a Y switch not shown and at the non-negated input terminal (+) thereof to a supply line for the reference voltage VREF. Further, the negative feedback amplifier AMP1 is connected at the output thereof to the gate of the NMOS transistor NT1. The NMOS transistor NT1 is connected at the source and the drain thereof to the second bit line RBL and the drain and gate of the PMOS transistor PT1, respectively. The PMOS transistor PT1 is connected at the source thereof to a supply line for a power supply voltage. Meanwhile, the amplifier AMP2 is connected at the non-negated input terminal (+) thereof to a supply line for a reading out voltage Vin and at the negated input terminal (−) thereof to a supply line for a reference voltage VREFSA.

In the reading out control section of the Y control section 170 having the configuration described above, if a desired second word line SWL whose address is designated is activated, then the second bit line RBL is clamped to the VREF potential by the negative feedback amplifier AMP1.

In a state wherein the second bit line RBL, that is, the p-type anode terminal, that is, the VREF terminal, of the thyristor element 112, is clamped at the VREF potential in this manner, the voltage Vin which varies depending upon the cell current of the thyristor RAM cell and the reference voltage VREFSA are compared with each other. Then, a result of the comparison is outputted as read data.

Here, an example of a more particular configuration of the Y control section 170 is described.

Figure 14:
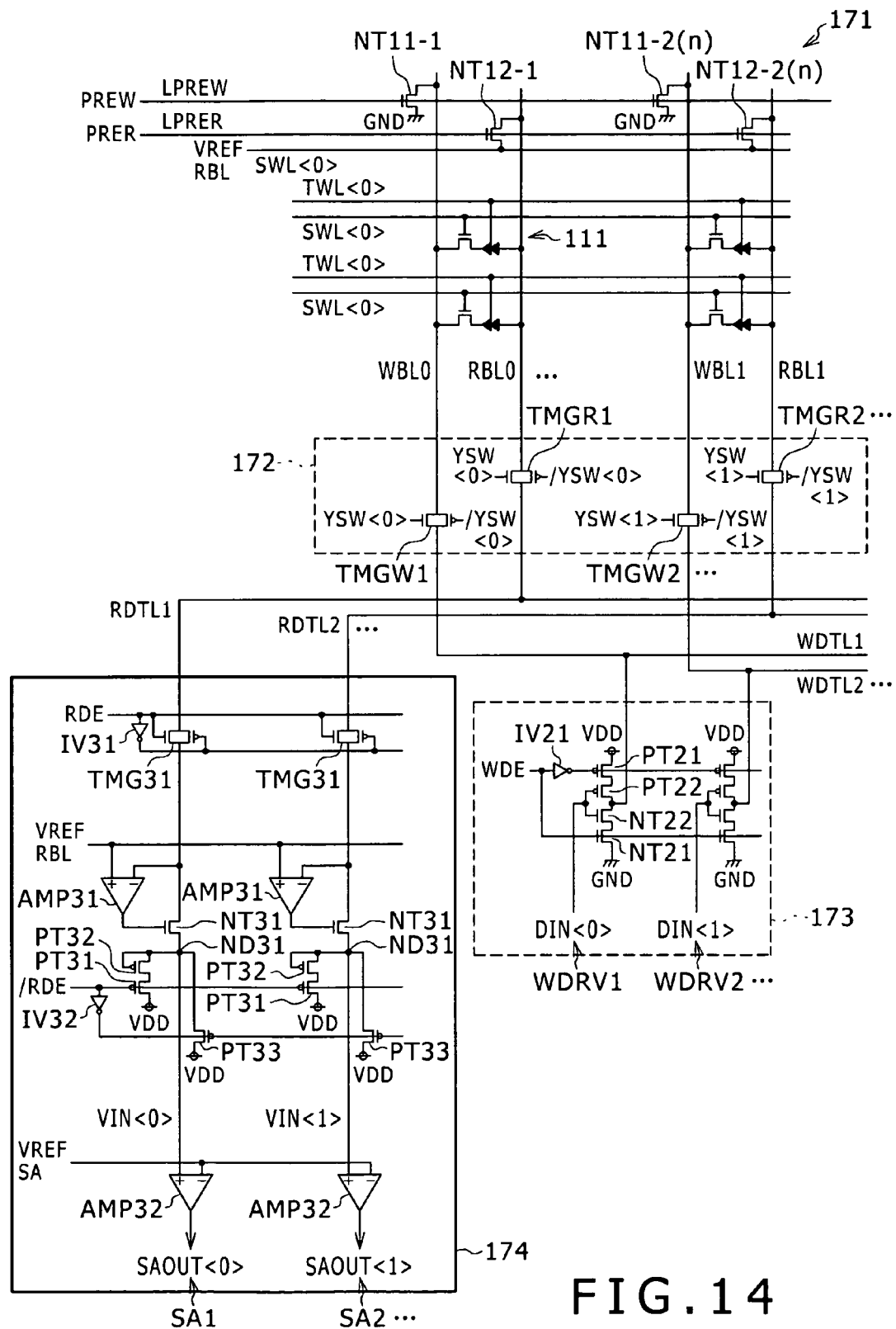
FIG. 14 is a circuit diagram showing an example of a configuration of a Y control section of the semiconductor device of FIG. 8.

FIG. 14 shows an example of a configuration of the Y control section in the present embodiment.

Referring to FIG. 14, the Y control section 170 includes a precharge circuit 171, a Y selector 172, a write driver group 173, and sense amplifier (SA) group 174.

The precharge circuit 171 includes NMOS transistors NT11-1 to NT11-n and NMOS transistors NT12-1 to NT12-n.

The NMOS transistors NT11-1 to NT11-n are connected at the source and the drain thereof to a ground potential GND and corresponding first bit lines WBL1 to WBLn, respectively, and at the gate thereof commonly to a supply line LPREW for a precharge signal PREW.

The NMOS transistors NT12-1 to NT12-n are connected at the source and the drain thereof to a supply line LVREFRBL for a common bit line reference voltage VREFRBL and the corresponding second bit lines WRL1 to WRLn, respectively, and at the gate thereof commonly to a supply line LPRER for a read precharge signal PRER.

The Y selector 172 includes first Y transfer gate switches TMGW1 to TMGWn for controlling connection between the first bit lines WBL1 to WBLn and write data transfer lines WDTL1 to WDTLn by a Y switch signal YSW and an inverted signal /YSW of the Y switch signal YSW produced in response to an address, and second Y transfer gate switches TMGR1 to TMGRn for controlling connection between the second bit lines RBL0 to RBLn and read data transfer lines RDTL1 to RDTLn by the Y switch signal YSW and the inverted signal /YSW of the Y switch signal YSW produced in response to the address.

It is to be noted that the Y transfer gate switch is formed from an NMOS transistor and a PMOS transistor which are connected at the source and the drain thereof to each other.

The write driver group 173 includes a plurality of write drivers WDRV1 to WDRVn for transferring input data DIN<0> to DIN<n> to the write data transfer lines WDTL1 to WDTLn, respectively.

The write drivers WDRV1 to WDRVn have a common configuration and are each formed as a clocked inverter which receives a write data enable signal WDE as a trigger.

Each write driver WDRV includes PMOS transistors PT21 and PT22, NMOS transistors NT21 and NT22 and an inverter IV21.

The PMOS transistor PT21 is connected at the source thereof to a supply line for the power supply voltage VDD and at the drain thereof to the source of the PMOS transistor PT22. The PMOS transistor PT22 is connected at the drain thereof to the drain of the NMOS transistor NT22, and the NMOS transistor NT22 is connected at the source thereof to the drain of the NMOS transistor NT21. The NMOS transistor NT21 is grounded at the source thereof. The inverter IV21 is connected at the input terminal thereof to a supply line for the write data enable signal WDE.

The PMOS transistors PT21 of the write drivers WDRV1 to WDRVn are connected commonly at the gate thereof to the output of the inverter IV21, and the NMOS transistors NT21 of the write drivers WDRV1 to WDRVn are connected commonly at the gate thereof to a supply line of the write data enable signal WDE.

The PMOS transistors PT22 and the NMOS transistors NT22 of the write drivers WDRV1 to WDRVn are connected at the gate thereof to input lines for input data DIN<0> to DIN<n>.

The sense amplifier group 174 has a plurality of sense amplifiers SA1 to SAn for sensing and reading out read data transferred along the read data transfer lines RDTL1 to RDTLn, respectively.

The sense amplifiers SA1 to SAn have a common configuration and each includes a negative feedback amplifier AMP31, an operational amplifier AMP32 for comparison, a transfer gate TMG31, an NMOS transistor NT31 for clamping, PMOS transistors PT31 to PT33, inverters IV31 to IV32, and a not circuit NOT31.

The transfer gate TMG31 is formed from an NMOS transistor and a PMOS transistor connected at the source and the drain thereof to each other, and is connected at an input and output terminal on one side thereof to read data transfer lines RDTL1 to RDTLn and one of the source/drain of the NMOS transistor NT31. Meanwhile, the transfer gate TMG31 is connected at the other input and output terminal thereof to the negated input terminal (−) of the negative feedback amplifier AMP31 and one of the source/drain of the NMOS transistor NT31. Further, the NMOS transistor of the transfer gate TMG31 is connected at the gate thereof to a supply line for a read data enable signal RDE, and the PMOS transistor of the transfer gate TMG31 is connected at the gate thereof to the supply line for the read data enable signal RDE through the inverter IV31.

The transfer gate TMG31 is placed into an on state, that is, into a conducting state, in response to the read data enable signal RDE supplied thereto in an active state.

The negative feedback amplifier AMP31 is connected at the non-negated input terminal (+) thereof to a supply line for the bit line reference voltage VREFRBL and at the output thereof to the gate of the NMOS transistor NT31.

The NMOS transistor NT31 is connected at the other one of the source/drain thereof to the drain of the PMOS transistor PT33 and the drain and the gate of the PMOS transistor PT32, and the connecting point of them forms a node ND31.

The PMOS transistor PT33 is connected at the source thereof to a supply line for the power supply voltage VDD, and the PMOS transistor PT32 is connected at the source thereof to the drain of the PMOS transistor PT31. Further, the PMOS transistor PT31 is connected at the source thereof to the supply line for the power supply voltage VDD.

The PMOS transistors PT31 are connected at the gate thereof commonly to a supply line for an inverted signal /RDE of the read data enable signal RDE, and the PMOS transistors PT33 are connected at the gate thereof commonly to the supply line for the inverted signal /RDE of the read data enable signal RDE through the inverter IV32.

The PMOS transistor PT33 has a function of precharging the node ND31 to a power supply voltage level upon reading out operation. Meanwhile, the PMOS transistor PT32 is connected in diode connection and functions as a load current element, and the PMOS transistor PT31 functions as a switch for connecting the PMOS transistor PT32 connected in diode connection and serving as a load current element to the power supply side upon reading out operation.

The amplifier AMP32 is connected at the non-negated input terminal (+) thereof to the supply line for the reading out voltage Vin, that is, to the node ND31, and at the negated input terminal (−) thereof to the supply line for the reference voltage VREFSA.

Now, operation of the semiconductor device having the configuration described above is described principally with regard to operation of the Y control section 170 with reference to FIGS. 15 to 18.

First, reading out operation of memory cell data is described.

Figure 15:
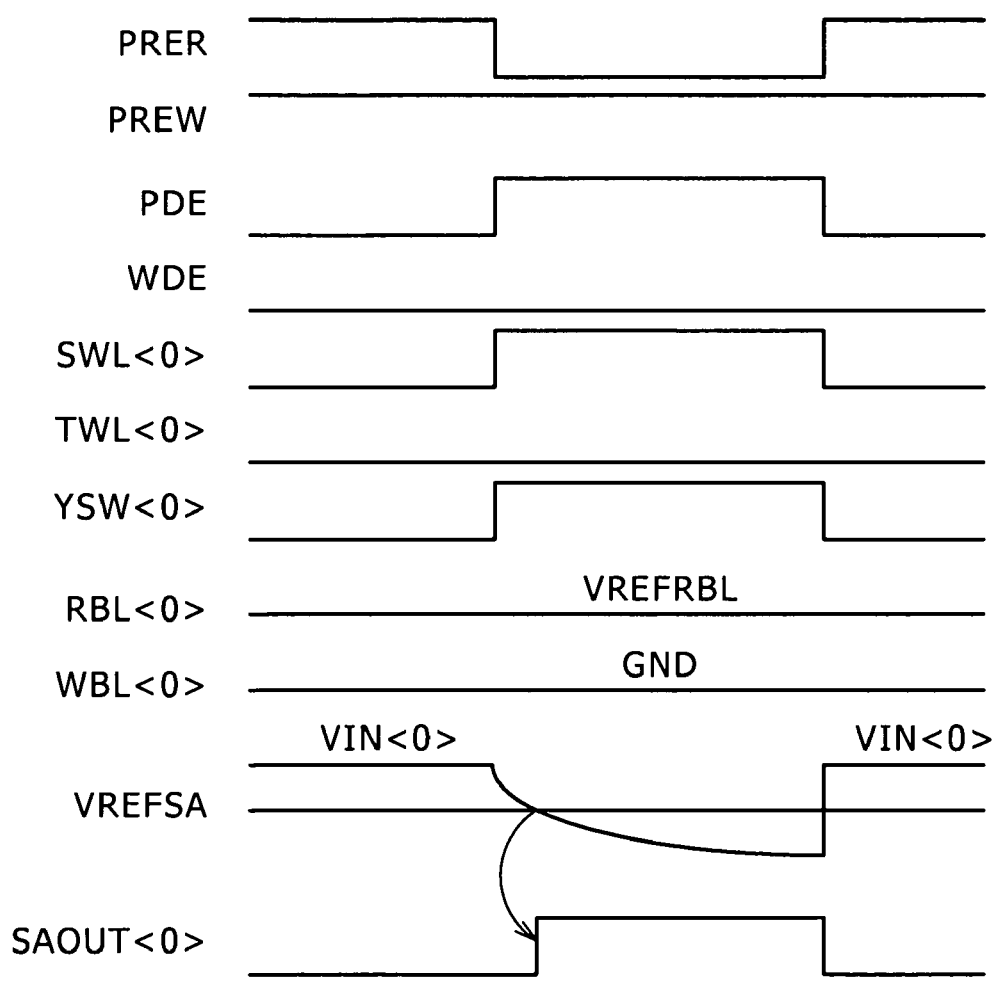
FIG. 15 is a waveform diagram illustrating operation of the semiconductor device of FIG. 8 upon reading out of data from cells on a second word line where the data is 1 and cell current is high.

FIG. 15 illustrates operation upon reading out of data 1 from cells of the second word line SWL<0> where the cell current is high.

In this instance, in a standby state, the write precharge signal PREW is supplied in a high level state, and as a result, the first bit line WBL0 is held at the ground potential GND or is reset. Further, the read precharge signal PRER is supplied in a high level state, and as a result, the second bit line RBL is reset to the bet line reference voltage VREFRBL.

At this time, the read data enable signal or reading out activation signal RDE, write data enable signal or writing activation signal WDE, second word line SWL, first word line TWL and Y switch signal YSW are set to the ground potential GND.

Then, when a reading out mode is entered, the desired second word line SWL rises to the high level and the cell current of the thyristor RAM cells 111 is placed into an on state, that is, cell current flows through the thyristor RAM cells 111.

Further, the read precharge signal PRER falls from the high level, that is, the power supply voltage level, to the low level, that is, to the ground potential level. Consequently, the second bit line RBL enters a floating state from a clamped state by the read precharge signal PRER. However, the Y switch signal YSW and the read data enable signal RDE rise to the high level to turn on the Y transfer gate switch TMGR1 and the transfer gate TMG31 to connect the sense amplifier SA and the second bit line RBL to each other.

As a result, the second bit line RBL is clamped to the voltage VREFRBL by the sense amplifier SA.

The stable point is changed, that is, the voltage VIN is changed, by the load current to the sense amplifier section, that is, by the load current through the diode formed by the PMOS transistor PT32 in FIG. 14, and the cell current. This fact is utilized to carry out reading operation by comparing the voltage VIN and the reference voltage VREFSA by means of the amplifier AMP32.

Since, upon reading out operation of high data, that is, data 1, the cell current is high, the voltage VIN drops from the reference voltage VREFSA. Since the voltage VIN is lower than the reference voltage VREFSA, the sense amplifier SA makes a decision of 1 and sets the output SAOUT to the high level.

Figure 16:
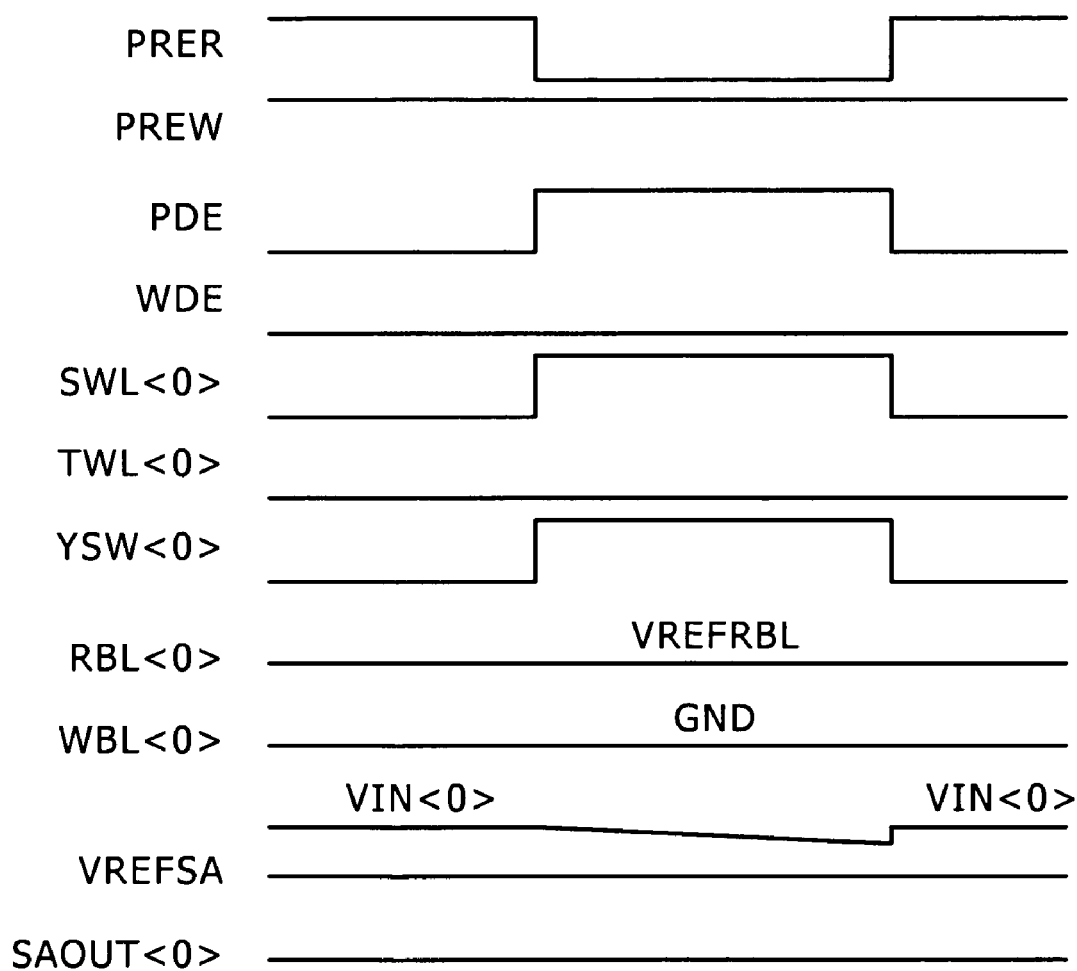
FIG. 16 is a similar view but illustrating operation of the semiconductor device of FIG. 8 upon reading out of data from the cells on the second word line where the data is 0 and cell current is low.

FIG. 16 illustrates operation of reading out of data 0 from the cells on the second word line SWL<0> where the cell current is low.

In this instance, although the operation is basically same as that described hereinabove with reference to FIG. 15, since the cell current is low, the dropping amount of the voltage VIN is small. Therefore, the sense amplifier SA makes a decision of 0.

Figure 7A:
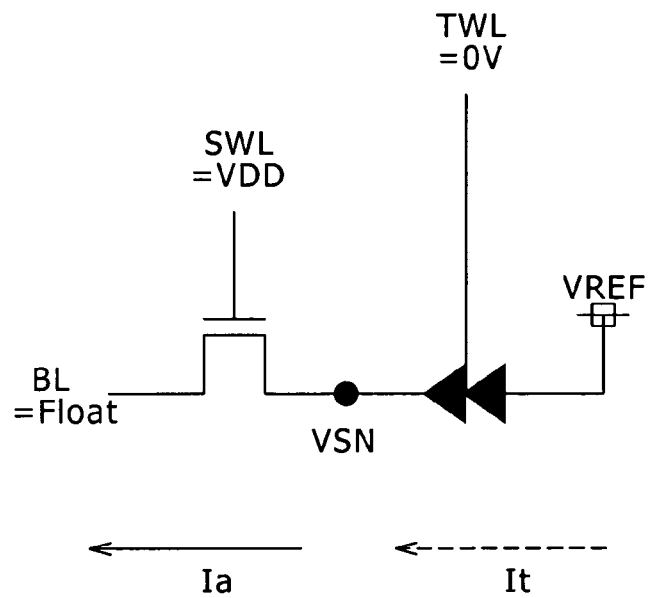
FIGS. 7A and 7B are a circuit diagram and a diagrammatic view, respectively, illustrating a cause of occurrence of disturb in the thyristor RAM cell upon reading out operation.
Figure 7B:
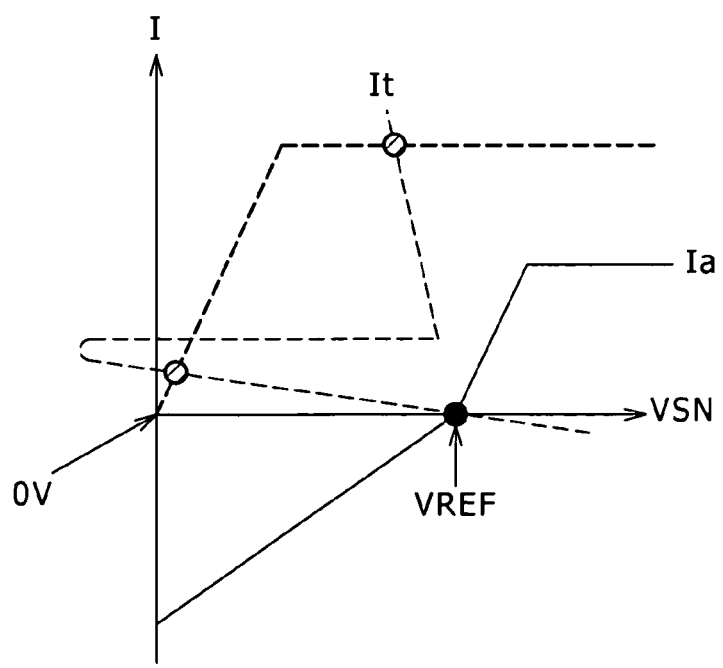

Since both of the bit lines RBL and WBL are placed, upon reading out operation, into a clamped state to a fixed voltage, the reading out operation does not have an influence of such read disturb as described hereinabove with reference to FIG. 7.

Now, writing operation of data into a memory cell is described.

Figure 17:
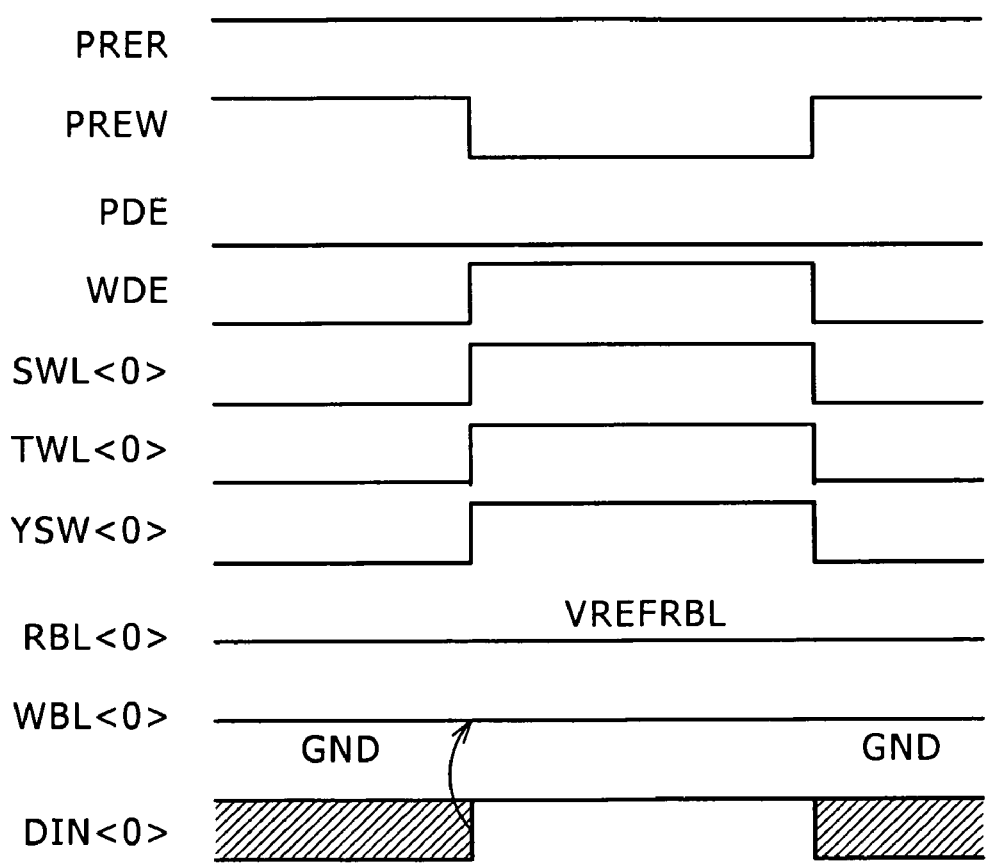
FIG. 17 is a similar view but illustrating operation of the semiconductor device of FIG. 8 upon writing of data into the cells on the second word line where the data is 1 and cell current is high.

FIG. 17 illustrates operation upon writing of data 1 into the cells on the second word line SWL<0> where the cell current is high.

In this instance, in the standby state, the write precharge signal PREW is supplied in a high-level state. As a result, the first bit line WBL0 is retained at the ground potential GND, that is, in a reset state. Further, the read precharge signal PRER is supplied in a high-level state. As a result, the second bit line RBL is reset to the bit line reference voltage VREFRBL.

At this time, the read data enable signal or reading out activation signal RDE, write data enable signal or writing activation signal WDE, second word line SWL, first word line TWL and Y switch signal YSW are set to the ground potential GND.

Then, when a writing mode is entered, the desired second word line SWL, first word line TWL and Y switch signal YSW rise to the high level. Meanwhile, the write precharge signal PREW falls to the low level, and consequently, the first bit line WBL enters a floating state from the ground potential GND.

Further, the desired first Y switch signal YSW and write data enable signal WDE rise from the low level to the high level to turn on the Y transfer gate switch TGNW1, whereupon the desired write driver WDRV and first bit line WBL are connected to each other.

Figure 5A:
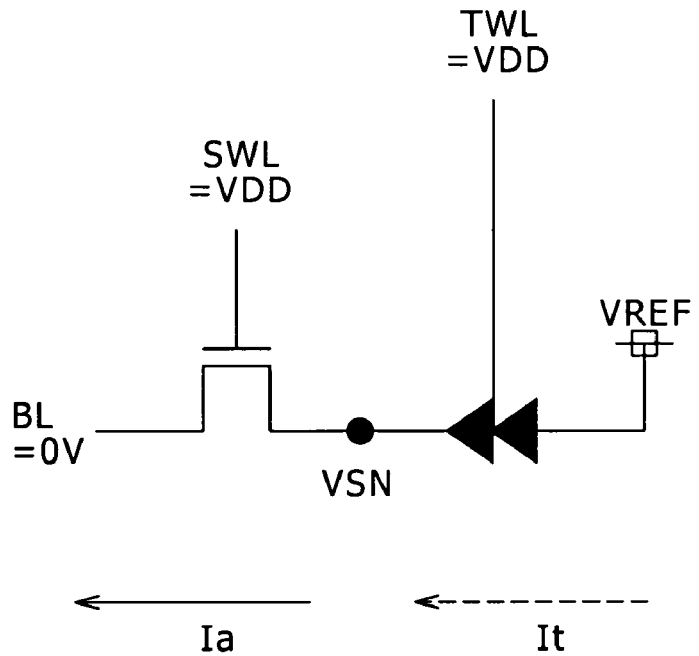
FIGS. 5A and 5B are a circuit diagram and a diagrammatic view, respectively, illustrating a potential state of the thyristor RAM cell upon writing operation of data "1"
Figure 5B:
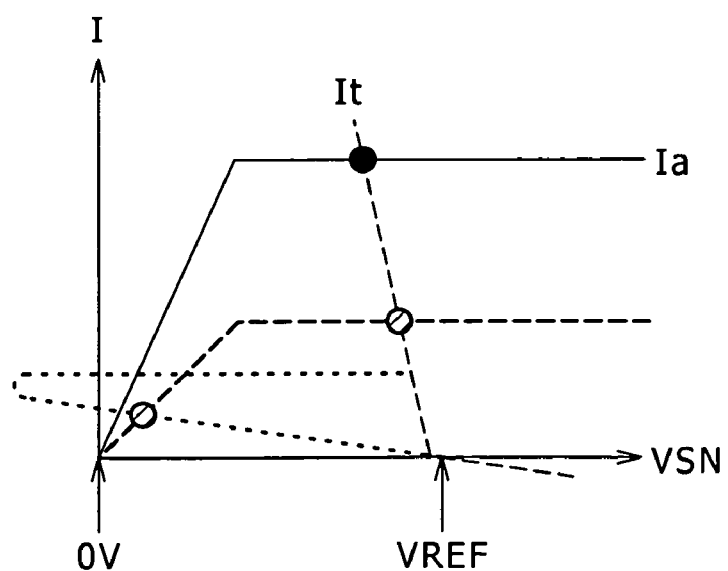

If the second word line SWL and the first word line TWL are activated to the high level in a state wherein the first bit line WBL is driven to 0 V by the write driver WDRV, then the stable point changes to the high cell current side as seen in FIG. 5 and the writing operation of the high data, that is, data 1, is completed.

Figure 18:
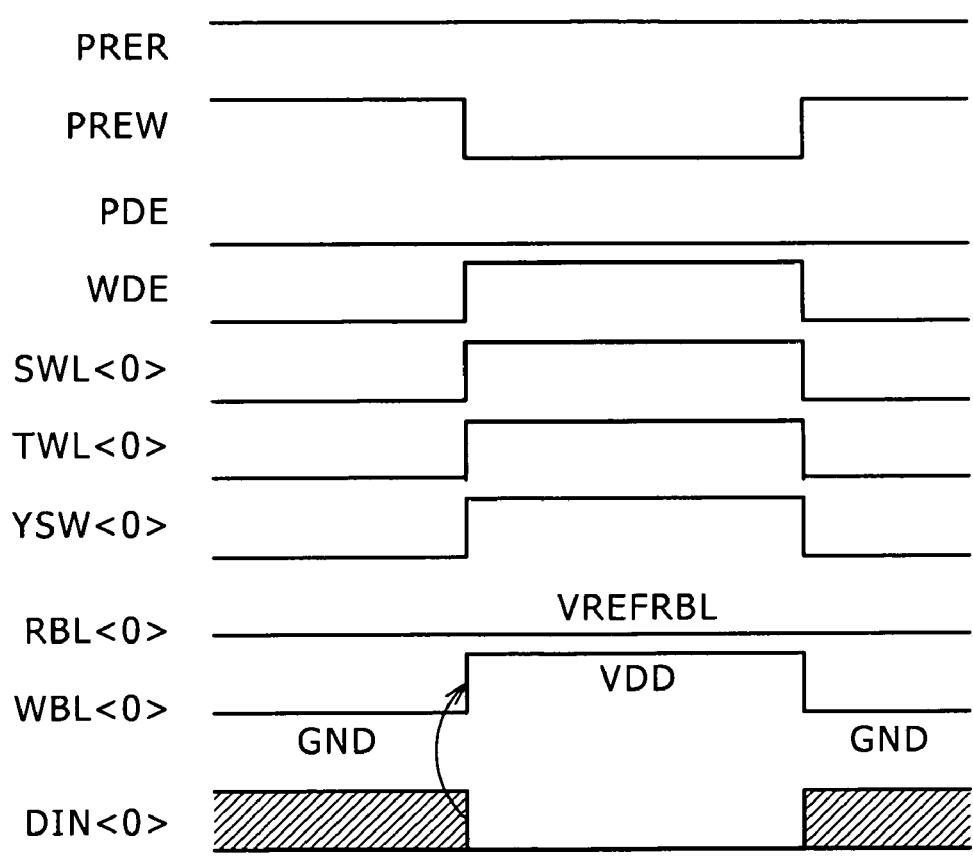
FIG. 18 is a similar view but illustrating operation of the semiconductor device of FIG. 8 upon writing of data into the cells on the second word line where the data is 0 and cell current is low.

FIG. 18 illustrates operation upon writing of data 0 into the cells on the second word line SWL<0> where the cell current is low.

Figure 6A:
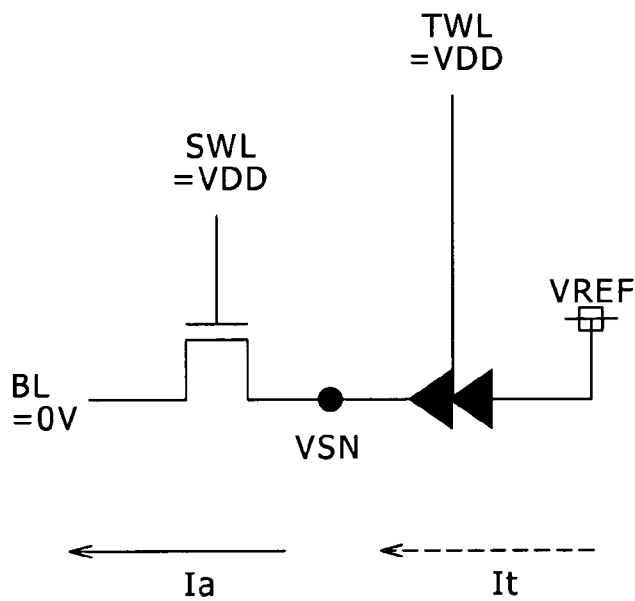
FIGS. 6A and 6B are a circuit diagram and a diagrammatic view, respectively, illustrating a potential state of the thyristor RAM cell upon writing operation of data "0"
Figure 6B:
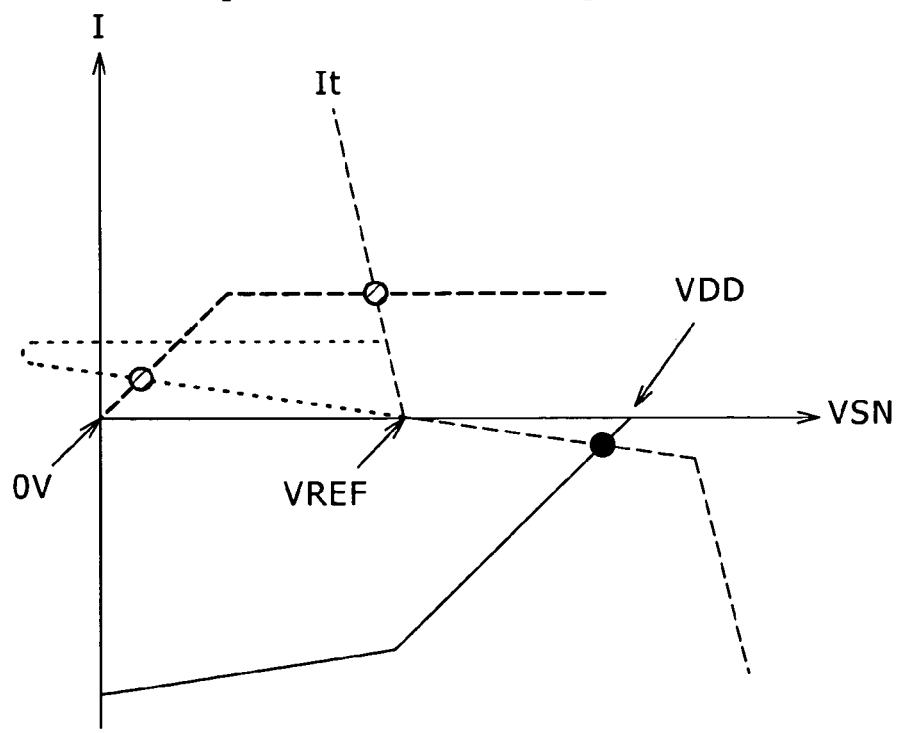

In this instance, the operation is same as that described hereinabove with reference to FIG. 17 except the potential at the first bit line WBL. In particular, as the potential at the first bit line WBL is driven by the power supply voltage VDD, the stable point changes to the low cell current side one as seen in FIG. 6B thereby to complete the writing operation of the low data, that is, data 0.

Figure 19:
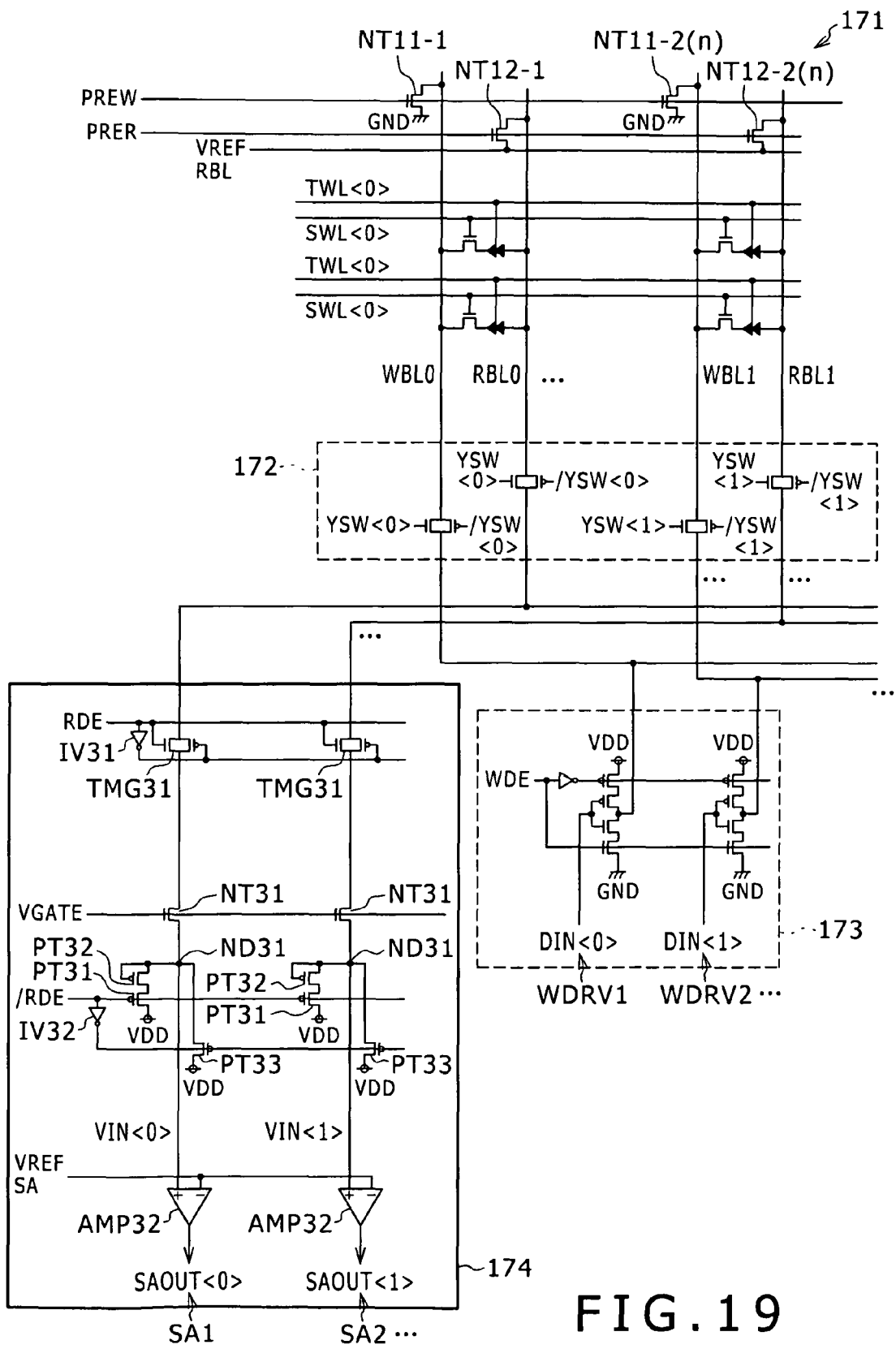
FIG. 19 is a circuit diagram showing another example of a configuration of the Y control section of the semiconductor device of FIG. 8.

FIG. 19 shows another example of operation of the Y control section in the present embodiment.

Referring to FIG. 19, the Y control section executes a memory cell data reading out process which is a modification to that of the Y control section illustrated in FIG. 14. The Y control section of FIG. 19 is different from that of FIG. 14 in that potential clamping of the second bit line RBL is controlled not by a negative feedback amplifier provided for each sense amplifier but by a fixed voltage VGATE.

The fixed voltage VGATE is set to a desired clamp potential (=VREFRBL+Vth1) to clamp the second bit line RBL to a potential VREFBL. Here, Vth1 represents the threshold voltage of the NMOS transistor NT31.

The Y control section of the configuration described above with reference to FIG. 19 is advantageous in that the number of elements is reduced and the area penalty is reduced from those of the Y control section described hereinabove with reference to FIG. 14.

It should be understood by those skilled in the art that various modifications, combinations, sub-combinations and alterations may occur depending on design requirements and other factors insofar as they are within the scope of the appended claims or the equivalents thereof.

What is claimed is:

1. A semiconductor device, comprising:
   a memory cell including a thyristor element with a gate having a pnpn structure formed on a semiconductor substrate and having first and second terminals, and an access transistor formed on said semiconductor substrate and having first and second terminals connected to a bit line and said first terminal of said thyristor element, respectively; and
   a control section including a load current element whose load current flows, upon reading out operation, to the second terminal side of said thyristor element and configured to carry out access control to said memory cell;
   said control section converting, upon reading out operation, current flowing through said memory cell into a voltage in a state wherein said bit line is fixed to a first voltage and the second terminal side of said thyristor element is set to a second voltage higher than the first voltage to carry out decision of read out data.

2. The semiconductor device according to claim 1, further comprising
   a circuit configured to clamp the potential at said bit line and the potential at said second terminal of said thyristor element to desired voltages.

3. The semiconductor device according to claim 1, wherein said control section varies, upon writing operation, the voltage to said bit line connected to said access transistor in response to write data and sets said second terminal of said thyristor element to a desired fixed voltage.

4. The semiconductor device according to claim 2, wherein said control section varies, upon writing operation, the voltage to said bit line connected to said access transistor in response to write data and sets said second terminal of said thyristor element to a desired fixed voltage both upon reading out operation and upon writing operation.

5. The semiconductor device according to claim 3, wherein said control section
   controls, upon reading out operation, said access transistor to be turned on from between said thyristor element and said access transistor, but controls, upon writing operation, both of said thyristor element and said access transistor to an on state.

6. The semiconductor device according to claim 4, wherein said control section
controls, upon reading out operation, said access transistor to be turned on from between said thyristor element and said access transistor, but
controls, upon writing operation, both of said thyristor element and said access transistor to an on state.

7. The semiconductor device according to claim 2, wherein said control section includes a sense amplifier configured to compare, upon reading out operation, the voltage which varies in response to cell current of said thyristor element and a reference voltage with each other in a state wherein said second terminal of said thyristor element is clamped to a desired voltage and output read data in accordance with a result of the comparison.

8. The semiconductor device according to claim 3, wherein said control section includes a write driver configured to drive, upon writing operation, said bit line connected to said access transistor to a voltage in accordance with write data.

9. A semiconductor device comprising:
a first bit line;
a second bit line;
a memory cell including a thyristor element with a gate having a pnpn structure formed on a semiconductor substrate and having first and second terminals, and an access transistor formed on said semiconductor substrate and having first and second terminals connected to a first bit line and said first terminal of said thyristor element, respectively; and
a control section including a load current element configured to supply, upon reading out, load current to said second bit line side connected to said second terminal of said thyristor element and configured to carry out access control to said memory cell;
said control section being operable to detect, upon reading out operation, a variation of current flowing from said second bit line to said second terminal of said thyristor element in a state wherein said first bit line is fixed to a first voltage and said second bit line is fixed to a second voltage higher than the first voltage and convert the detected current into a voltage to carry out decision of read out data.

10. The semiconductor device according to claim 9, further comprising
a circuit configured to clamp the potentials at said first bit line and said second bit line to desired voltages.

11. The semiconductor device according to claim 9, wherein said control section varies, upon writing operation, the voltage to said first bit line connected to said access transistor in accordance with data, but sets the voltage to said second bit line connected to a reference potential terminal of said thyristor element to a desired fixed voltage both upon reading out operation and upon writing operation.

12. The semiconductor device according to claim 10, wherein said control section varies, upon writing operation, the voltage to said first bit line connected to said access transistor in accordance with write data and sets the voltage to said second bit line connected to said second terminal of said thyristor element to a desired fixed voltage both upon reading out operation and upon writing operation.

13. The semiconductor device according to claim 11, wherein said control section
turns on, upon reading out operation, said access transistor from between said thyristor element and said access transistor to carry out reading out of data through said second bit line, but
controls, upon writing operation, both of said thyristor element and said access transistor to an on state to transfer write data to said first bit line.

14. The semiconductor device according to claim 12, wherein said control section
turns on, upon reading out operation, said access transistor from between said thyristor element and said access transistor to carry out reading out of data through said second bit line, but
controls, upon writing operation, both of said thyristor element and said access transistor to an on state to transfer write data to said first bit line.

15. The semiconductor device according to claim 10, wherein said control section includes a sense amplifier configured to compare, upon reading out operation, a voltage which varies in response to cell current of said thyristor element and a reference voltage with each other in a state wherein said second bit line is clamped to a desired voltage and output read data in accordance with a result of the comparison.

16. The semiconductor device according to claim 11, wherein said control section includes a write driver configured to drive, upon writing operation, said first bit line connected to said access transistor to a voltage in accordance with write data.

* * * * *